(12) United States Patent
Kuroda et al.

(10) Patent No.: US 6,351,369 B1
(45) Date of Patent: Feb. 26, 2002

(54) MULTI-LAYER CAPACITOR, WIRING SUBSTRATE, DECOUPLING CIRCUIT, AND HIGH-FREQUENCY CIRCUIT

(75) Inventors: Yoichi Kuroda, Fukui; Masaaki Taniguchi, Fukui-ken; Yasuyuki Naito, Takefu; Haruo Hori; Takanori Kondo, both of Sabae, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/514,516

(22) Filed: Feb. 28, 2000

(30) Foreign Application Priority Data

Nov. 19, 1999 (JP) .............................. 11-329013

(51) Int. Cl.$^7$ .................... H01G 4/228; H01G 4/06; H01G 4/20; H01G 4/05
(52) U.S. Cl. .................. 361/306.3; 361/313; 361/303
(58) Field of Search .................. 361/301.1, 301.3, 361/301.4, 303, 306.1–306.3, 302, 308.1, 308.2, 309, 311–313, 320, 321.1–321.5, 328–330, 766

(56) References Cited

U.S. PATENT DOCUMENTS

| | | | |
|---|---|---|---|
| 5,177,670 A | * | 1/1993 | Shinohara et al. .......... 361/388 |
| 6,191,479 B1 | * | 2/1999 | Herrell et al. .............. 257/724 |
| 5,880,925 A | | 3/1999 | DuPré et al. |
| 6,034,864 A | * | 3/2000 | Naito et al. .............. 361/306.1 |

FOREIGN PATENT DOCUMENTS

| | | | | |
|---|---|---|---|---|
| EP | 091715 A2 | * | 5/1999 | ............ H01G/4/30 |
| JP | 60-158612 | | 8/1985 | |
| JP | 2-159008 | | 6/1990 | |
| JP | 2-256216 | | 10/1990 | |
| JP | 5-205966 | | 8/1993 | |
| JP | 11-144996 | | 5/1995 | |
| JP | 7-201651 | | 8/1995 | |
| JP | 7-326536 | | 12/1995 | |
| JP | 11-204372 | | 7/1999 | |

* cited by examiner

*Primary Examiner*—Dean A. Reichard
*Assistant Examiner*—Eric W. Thomas
(74) *Attorney, Agent, or Firm*—Keating & Bennett, LLP (57) ABSTRACT

A multi-layer capacitor achieves significant reduction in equivalent series inductance (ESL) and includes first inner electrodes and second inner electrodes opposing each other, first feed-through conductors and second feed-through conductors, and first outer terminal electrodes and second outer terminal electrodes. The first feed-through conductors electrically connect the first inner electrodes and the first outer terminal electrodes, and the second feed-through conductors electrically connect the second inner electrodes and the second outer terminal electrodes. The first and second feed-through conductors are arranged such that the feed-through conductors mutually cancel magnetic fields induced by current flowing through the first and second inner electrodes. Furthermore, when an alignment pitch of the first and second feed-through conductors is indicated by P and the total number of the first and second feed-through conductors is indicated by N, an arrangement is set such that a ratio of P/N is about 0.085 mm or lower.

37 Claims, 4 Drawing Sheets

MULTI-LAYER CAPACITOR, WIRING SUBSTRATE, DECOUPLING CIRCUIT, AND HIGH-FREQUENCY CIRCUIT

BACKGROUND OF THE INVENTION

1. Field of the Invention

The present invention relates to multi-layer capacitors, wiring substrates, decoupling circuits, and high-frequency circuits. More particularly, the present invention relates to multi-layer capacitors adapted for improving high-frequency circuits, and wiring substrates, decoupling circuits, and high frequency circuits, which are defined by the multi-layer capacitors.

2. Description of the Related Art

Most conventional multi-layer capacitors are formed of ceramic dielectric materials or the like. Such multi-layer capacitors include a capacitor having a plurality of laminated dielectric layers, a plurality of pairs of mutually opposed first inner electrodes and a plurality of pairs of mutually opposed second inner electrodes alternately disposed in a direction in which the dielectric layers are laminated, the pairs of electrodes opposing via the dielectric layers so as to define a plurality of capacitor units. A first outer terminal electrode is provided on a first end surface of the capacitor, and a second outer terminal electrode is provided on a second end surface thereof. The first inner electrodes are extended out to the first end surface of the capacitor to be electrically connected to the first outer terminal electrode. In addition, the second inner electrodes are extended out to the second end surface of the capacitor to be electrically connected to the second outer terminal electrode.

In the above-described multi-layer capacitor, for example, current flows from the second outer terminal electrode to the first outer terminal electrode, and more specifically, the current flows from the second outer terminal electrode to the second inner electrode, from which the current passes through a dielectric layer to reach the first inner electrode, and then, after passing through the first inner electrode, reaches the first outer terminal electrode.

When the capacitance of a capacitor is indicated by the symbol C, an equivalent series inductance (ESL) is indicated by the symbol L, and the resistance of an electrode referred to as an equivalent series resistance (ESR) is indicated by the symbol R, an equivalent circuit of the capacitor is represented by a circuit in which the capacitance, the equivalent series inductance, and the equivalent series resistance indicated by the symbols C, L, and R, respectively, are connected in series.

In this equivalent circuit, a resonant frequency $f_o$, is equal to a value obtained by an expression $1/[2\pi \times (L \times C)^{1/2}]$, and the circuit does not function as a capacitor at frequencies higher than the resonant frequency. In other words, when a value of L, that is, the value of ESL is small, the resonant frequency $f_o$ is higher, so that the circuit can be used at higher frequencies. Although the use of copper for inner electrodes has been considered in order to reduce the value of ESR, a capacitor having a reduced ESL value is required when the capacitor is used in microwave regions.

Figure 8:
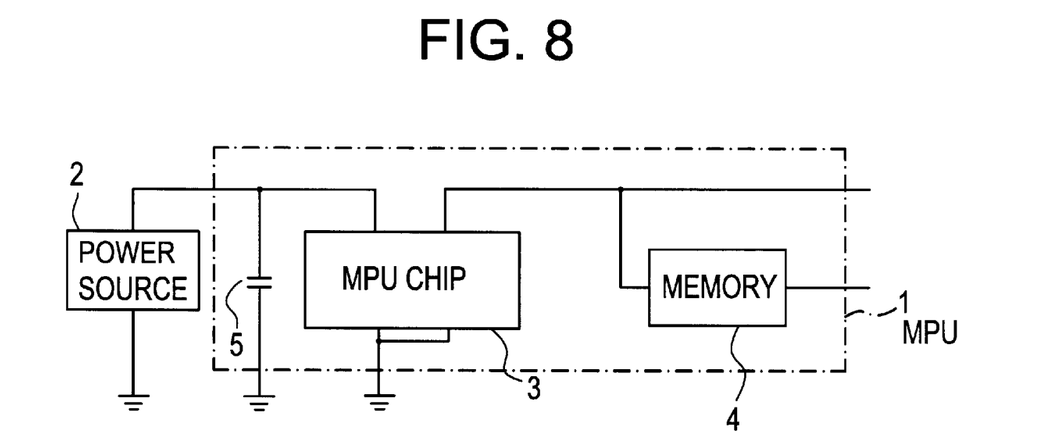
FIG. 8 is a block diagram illustrating the structure in which an MPU 1 and a power source unit 2 are connected.

In addition, it is also necessary to reduce the ESL value in a capacitor used as a decoupling capacitor connected to a power supply circuit supplying power to an MPU chip as a micro-processing unit contained in a work station, a personal computer, and other such electronic apparatuses including a microprocessor. FIG. 8 is a block diagram illustrating one example of the structure in which an MPU1 and a power supply unit are connected.

In FIG. 8, the MPU 1 has a MPU chip 3 and a memory unit 4. The power supply unit 2 supplies power to the MPU chip 3. A decoupling capacitor 5 is connected to a power supply circuit from the power supply unit 2 to the MPU chip 3. In addition, a signal circuit is disposed on the side of the memory unit 4 extending from the MPU chip 3.

Similar to a typical type of decoupling capacitor, the decoupling capacitor 5 included in the above-described MPU 1 is used for absorbing noise and smoothing power-source fluctuations. Additionally, production of the MPU chip 3, having an operational frequency is over 500 MHz and up to as much as 1 GHz has been recently planned. Regarding such an MPU chip 3, in order to achieve high speed operations, it is necessary to have a fast power supplying function to supply power within a few nanoseconds, from the electrical power charged in a capacitor, when power is immediately needed, for example, during start-up.

Therefore, in the decoupling capacitor 5 used in the MPU 1, it is necessary to have as low an inductance component as possible, for instance, 10 pH or lower. Thus, a capacitor having such a low inductance is needed for such applications.

More specifically, in a certain MPU chip 3 having an operational clock frequency of approximately 500 MHz, a DC power of approximately 2.0 V is supplied, and power consumption is approximately 24 W, that is, it is designed such that a current of about 12 A flows. In order to reduce the power consumption, when an MPU 1 is not operating, a sleep mode in which the power consumption drops to 1 W or lower, is adopted. When converted from a sleep mode to an active mode, power necessary for the active mode needs to be supplied to the MPU chip 3 during the operational clock. For example, at the operational frequency of 500 MHz, when converted from the sleep mode to the active mode, power needs to be supplied within about 4 to 7 nanometer seconds.

However, since it is impossible to supply the above-described power from the power supply unit 2 in time, power is supplied to the MPU chip 3 by releasing the charge stored in the decoupling capacitor 5 disposed in proximity to the MPU chip 3 during the period of time before power from the power supply unit 2 is supplied.

When the operational clock frequency is 1 GHz, in order to satisfy such a function, the ESL value of the decoupling capacitor 5 disposed in proximity to the MPU chip 3 needs to be at least 10 pH or lower.

Since the ESL value of the aforementioned conventional multi-layer capacitor is in a range of approximately 500 pH to 800 pH, it is much higher than the value of 10 pH described above. An inductance component is generated in a multi-layer capacitor because a magnetic flux having direction determined by a direction of current flowing through the multi-layer capacitor is induced, by which a self-inductance component is generated.

Relating to the above-described background, the structures of multi-layer capacitors capable of achieving reduction in ESL are presented in, for example, Japanese Unexamined Patent Publication No. 2-256216, U.S. Pat. No. 5,880,925, Japanese Unexamined Patent Publication No. 2-159008, Japanese Unexamined Patent Publication No. 11-144996, and Japanese Unexamined Patent Publication No. 7-201651.

The aforementioned reduction in ESL is achieved mainly by cancellation of the magnetic flux induced in the multi-layer capacitor. In order to generate such a cancellation of the magnetic flux, the direction of current flowing through the multi-layer capacitor is diversified. In addition, in order to diversify the direction of current, the number of terminal electrodes disposed on an outer surface of the capacitor and the number of parts of inner electrodes extending to be electrically connected to the terminal electrodes are increased, and then, the extended parts of the inner electrodes are arranged to be oriented in various directions.

However, the above-described measures for obtaining a reduced ESL value in the multi-layer capacitor as described above are not yet effective enough. For instance, although a structure in which the inner electrodes are extended out to the two opposing side surfaces of the capacitor is described in Japanese Unexamined Patent Publication No. 2-256216, U.S. Pat. No. 5,880,925, and Japanese Unexamined Patent Publication No. 2-159008, the ESL value can be reduced only down to approximately 100 pH.

Furthermore, in Japanese Unexamined Patent Publication No. 11-144996, although a structure in which the inner electrodes are extended out to the four side surfaces of the capacitor is described, the most effective value of ESL in this case is not lower than 40 pH.

Furthermore, in Japanese Unexamined Patent Publication No. 7-201651, although a structure in which the inner electrodes are extended out to the upper and lower main surfaces of the capacitor is described, the most effective value of ESL in this case is not lower than 50 pH.

Therefore, conventionally, in a high frequency circuit including a power supply line, which is used for an MPU chip incorporating such a multi-layer capacitor, for example, in order to obtain the ESL values of 10 pH or lower, a plurality of multi-layer capacitors connected in parallel must be mounted on a wiring substrate. As a result, an area required for mounting the multi-layer capacitors is greatly increased, which prevents a reduction in costs and size of electronic apparatuses defining such high frequency circuits.

SUMMARY OF THE INVENTION

In order to overcome the problems described above, preferred embodiments of the present invention provide a multi-layer capacitor which greatly and effectively reduces an ESL value and to provide a wiring substrate, a decoupling circuit, and a high frequency circuit including such a novel multi-layer capacitor.

According to a first preferred embodiment of the present invention, there is provided a multi-layer capacitor having a capacitor main body including a plurality of laminated dielectric layers. Inside of the capacitor main body, at least one pair of substantially rectangular first inner electrodes and at least one pair of substantially rectangular second inner electrodes which are mutually opposed via specified dielectric layers of the dielectric layers are provided. First outer terminal electrodes and second outer terminal electrodes are disposed on at least one main surface extending substantially parallel to the first and second inner electrodes of the capacitor.

Furthermore, a plurality of first feed-through conductors and a plurality of second feed-through conductors are disposed inside of the capacitor. The first feed-through conductors pass through specified dielectric layers of the plurality of the dielectric layers to electrically connect the first inner electrodes and the first outer terminal electrodes such that the first feed-through conductors are electrically insulated from the second inner electrodes, and the second feed-through conductors pass through specified dielectric layers to electrically connect the second inner electrodes and the second outer terminal electrodes such that the second feed-through conductors are electrically insulated from the first inner electrodes.

The pluralities of the first and second feed-through conductors are distributed over the entire areas of the first and second inner electrodes.

The first and second feed-through conductors are arranged such that the first and second feed-through conductors mutually cancel magnetic fields induced by current flowing through the first and second inner electrodes, and the first and second feed-through conductors are disposed adjacent to each other to be distributed substantially at corners of a square.

In order to solve the aforementioned technological problems, when an alignment pitch of the first and second feed-through conductors is indicated by P and the total number of the first and second feed-through conductors is indicated by N, an arrangement is set such that a ratio of P/N is about 0.085 mm or lower.

Even more preferably, the ratio P/N is no more than about 0.04 mm.

Preferably, in the multi-layer capacitor in accordance with preferred embodiments of the present invention, the first and second outer terminal electrodes are distributed in a dotted configuration corresponding to the first and second feed-through conductors.

Preferably, in this case, a solder bump is provided at each of the first and second outer terminal electrodes.

In addition, in the multi-layer capacitor in accordance with preferred embodiments of the present invention, preferably, the first and second outer terminal electrodes are disposed only on one main surface of the capacitor. Alternatively, the first and second outer terminal electrodes may be disposed on both main surfaces of the capacitor, or the first outer terminal electrodes may be disposed on one main surface of the capacitor and the second outer terminal electrodes may be disposed on the other main surface thereof.

The multi-layer capacitor in accordance with preferred embodiments of the present invention may be arranged to define a decoupling capacitor connected to a power supply circuit for an MPU chip incorporated in a micro-processing unit as an MPU.

In addition, according to another preferred embodiment of the present invention, there is provided a wiring substrate on which one of the above-described multi-layer capacitors is mounted.

As described above, when a multi-layer capacitor according to preferred embodiments of the present invention is applied to a wiring substrate, as one of the specific preferred embodiments, an MPU chip incorporated in a micro-processing unit may be mounted on the wiring substrate. In addition, on the wiring substrate, a power-supply hot-side wiring conductor for supplying a power used for the MPU chip and a ground wiring conductor may be disposed. One of the first outer terminal electrodes and the second outer terminal electrodes of the multi-layer capacitor may be electrically connected to the power-supply hot-side wiring conductor, and the other one of the first outer terminal electrodes and the second outer terminal electrodes may be connected to the ground wiring conductor.

Preferably, the first and second outer terminal electrodes may be each connected to the wiring substrate described above by a bump.

According to another preferred embodiment of the present invention, there is provided a decoupling circuit including one of the novel multi-layer capacitors described above.

According to another preferred embodiment of the present invention, there is provided a high frequency circuit including one of the multi-layer capacitors described above.

Other features, elements, advantages and aspects of the present invention will be described in the following detailed description of preferred embodiments of the present invention with reference to the attached drawings, wherein like reference numerals indicate like elements.

BRIEF DESCRIPTION OF THE DRAWINGS

FIG. 1 is a plan view illustrating the inner structure of a multi-layer capacitor 11 in accordance with a first preferred embodiment of the present invention wherein

DETAILED DESCRIPTION OF PREFERRED EMBODIMENTS

Figure 1A:
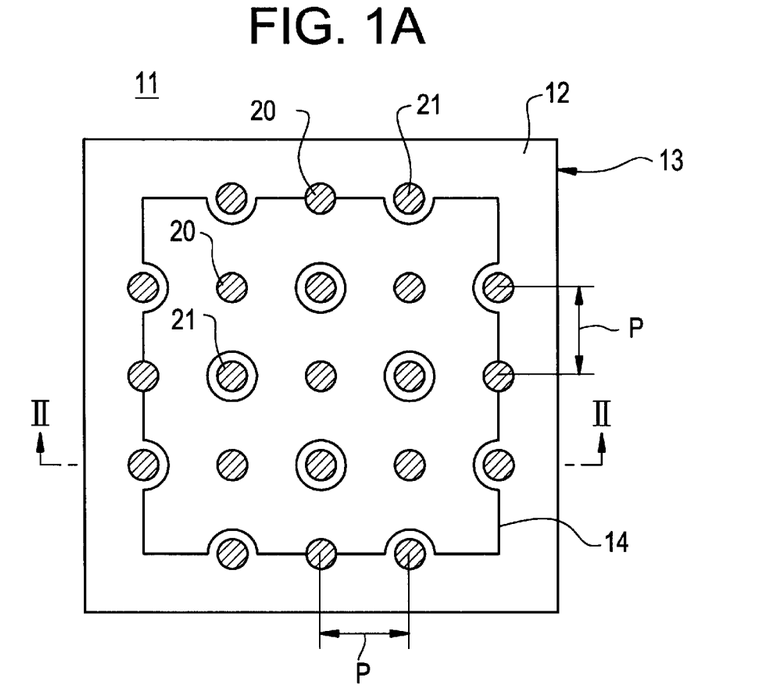
FIG. 1A is a sectional surface where a first inner electrode 14 is disposed and FIG. 1B is a sectional surface where a second inner electrode 15 is disposed.
Figure 1B:
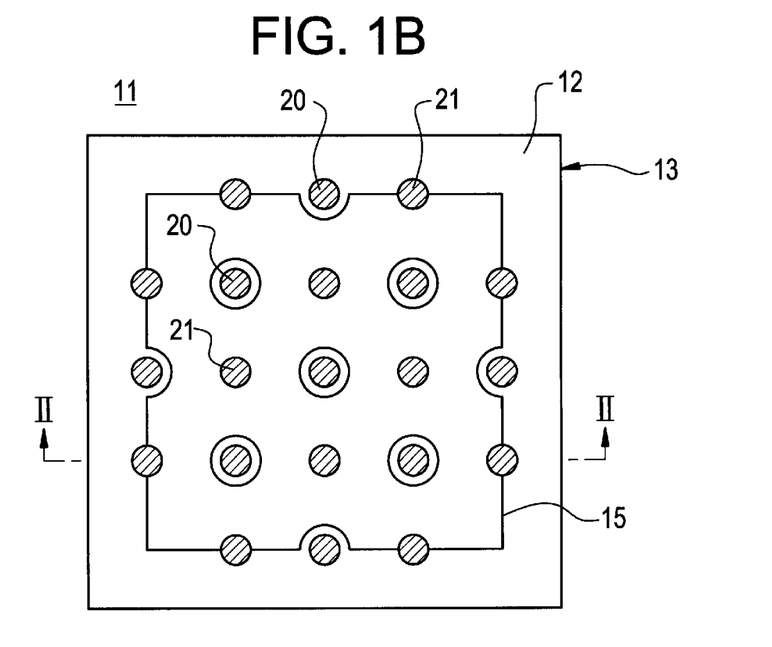
Figure 2:
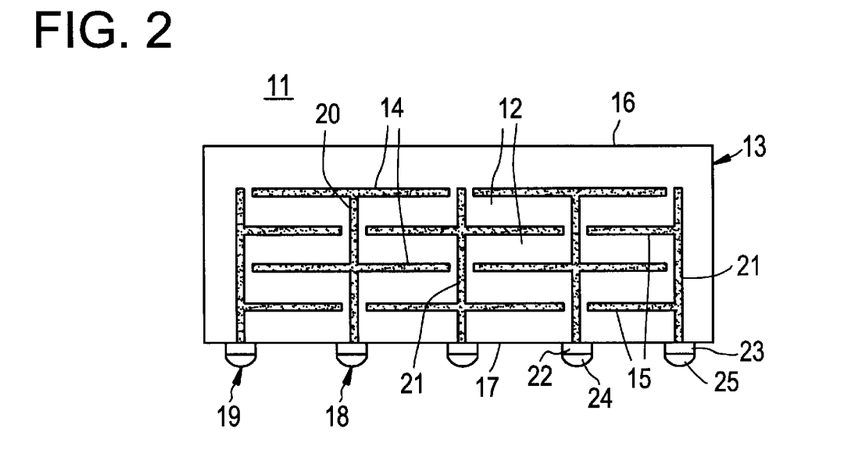
FIG. 2 is a sectional view taken along a line II—II shown in FIGS. 1A and 1B.

FIGS. 1A, 1B, and 2 each show a multi-layer capacitor 11 in accordance with a first preferred embodiment of the present invention. FIGS. 1A and 1B are plan views illustrating the inner structures of the multi-layer capacitor 11, in which FIGS. 1A and 1B show different sectional surfaces. In addition, FIG. 2 is a sectional view taken along a line II—II shown in FIGS. 1A and 1B.

The multi-layer capacitor 11 has a main capacitor body 13 including a plurality of laminated dielectric layers 12. The dielectric layers 12 are preferably made of, for example, ceramic dielectric materials.

Inside of the capacitor body 13, at least one pair of first substantially rectangular inner electrodes 14 and at least one pair of second substantially rectangular inner electrodes 15 are disposed, each of the pairs of the electrodes being mutually opposed via a specified dielectric layer 12. In this preferred embodiment, the first and second inner electrodes 14 and 15, respectively, preferably have a substantially square shape. In addition, a plurality of the pairs of first inner electrodes 14 and a plurality of the pairs of second inner electrodes 15 are disposed.

Furthermore, on at least one of main surfaces 16 and 17 of the capacitor 13, which extend substantially parallel to the inner electrodes 14 and 15, first outer terminal electrodes 18 and second outer terminal electrodes 19 are disposed. In the first preferred embodiment, these outer terminal electrodes 18 and 19 are preferably provided on the main surface 17.

The first and second outer terminal electrodes 18 and 19, respectively, are disposed on the main surface 17 such that the outer terminal electrodes 18 and 19 are arranged in a dotted configuration corresponding to locations of first feed-through conductors 20 and second feed-through conductors 21. Additionally, in this preferred embodiment, the first outer terminal electrodes 18 preferably include conductive pads 22 with solder bumps 24 provided thereon, and the second outer terminal electrodes 19 preferably include conductive pads 23 with solder bumps 25 disposed thereon.

Furthermore, inside of the capacitor body 13, a plurality of the first feed-through conductors 20 pass through specified dielectric layers 12 to electrically connect the first inner electrodes 14 and the first outer terminal electrodes 18 such that the first feed-through conductors 20 are electrically insulated from the second inner electrodes 15. Additionally, a plurality of the second feed-through conductors 21 passes through specified dielectric layers 12 to electrically connect the second inner electrodes 15 and the second outer terminal electrodes 19 such that the second feed-through conductors 21 are electrically insulated from the first inner electrodes 14.

The pluralities of the first and second feed-through conductors 20 and 21, respectively, are preferably distributed over the entire areas of the first inner electrodes 14 and the second inner electrodes 15.

In this preferred embodiment, the plurality of the first inner electrodes 14 and the plurality of the second inner electrodes 15 are disposed such that capacitances defined between the first inner electrodes 14 and the second inner electrodes 15 are connected in parallel by the first and second feed-through conductors 20 and 21. The capacitances connected in parallel are led out between the first and second outer terminal electrodes 18 and 19, respectively.

The first feed-through conductors 20 and the second feed-through conductors 21 are positioned such that the feed-through conductors 20 and 21 mutually cancel magnetic fields induced by current flowing through the inner electrodes 14 and 15. In addition, the first feed-through conductors 20 and the second feed-through conductors 21 are positioned adjacent to each other such that they are substantially distributed at corners of a substantially square-shaped electrodes.

As the characteristic structure of the multi-layer capacitor in accordance with preferred embodiments of the present invention, when an alignment pitch of the first and second feed-through conductors 20 and 21, respectively, is indicated by the symbol P, and the total number of the first feed-through conductors 20 and the second feed-through conductors 21 is indicated by the symbol N, a value of P/N is preferably about 0.085 mm or lower, and preferably, about 0.04 mm or lower.

For example, when the specified multi-layer capacitor 11 shown in FIGS. 1A and 1B is illustrated, since the total number N of the first and second feed-through conductors 20 and 21, respectively, in this multi-layer capacitor 11, is 25 (5×5), in order to obtain a value of P/N of about 0.085 mm or lower, the pitch alignment P of the first and second feed-through conductors 20 and 21, respectively, is about 2.215 mm or less (0.085×25 mm), and preferably, in order to obtain a value of P/N of about 0.04 mm or lower, the alignment pitch P is about 1 mm or less (0.04×25 mm).

Therefore, when the alignment pitch P is about 2.215mm or less, for example, about 2 mm, the first and second feed-through conductors 20 and 21, respectively, having the total number N of 25 (5×5) can be positioned, for example, on substantially square inner electrodes 14 and 15 each having sides with a length of about 8 mm (2×(5−1)).

When illustrated from another viewpoint, for example, in a case where each of the first and second inner electrodes 14 and 15, respectively, has a substantially square configuration (8 mm×8 mm), when the first and second feed-through conductors 20 and 21, respectively, having a total number N is 25 (5×5) are arranged to be distributed as shown in FIGS. 1A and 1B, the alignment pitch P of the feed-through conductors 20 and 21 is 2 mm (8÷4), and the value of P/N is about 0.08 mm (2/25 mm), with the result that the ratio P/N=0.085 mm can be satisfied.

Such conditions are obtained by tests conducted in order to estimate the effects of reducing an ESL value. A description will be given below of the results of the tests.

Based on the structure for disposing the multi-layer capacitor 11 as shown in FIGS. 1A, 1B, and FIG. 2, values of ESL were obtained for three cases of dimensions of approximately 2.5 mm×2.5 mm, 4.5 mm×4.5 mm, and 10.0 mm×10.0 mm in terms of the main surfaces 16 and 17 included in the capacitor 13. In relation to the three samples with the different dimensions of the main surfaces, the total number N of the feed-through conductors 20 and 21 was changed, and according to the value of N, the alignment pitch P of the feed-through conductors 20 and 21 was also changed so as to obtain an ESL value. In this case, each ESL value was obtained from a self-resonance frequency obtained by measuring frequency characteristics with a network analyzer.

In Table 1 below, in a multi-layer capacitor having the main surfaces with dimensions of approximately 2.5 mm×2.5 mm, and the inner electrodes with dimensions of about 2.0 mm×2.0 mm, the relationships between the values of P/N and the values of ESL are shown when the total number N of the feed- through conductors and the alignment pitch P of the feed-through conductors were changed.

TABLE 1

| | FEED-THROUGH CONDUCTOR | | | |
|---|---|---|---|---|
| SAMPLE NUMBER | TOTAL NUMBER(N) | ALIGNMENT PITCH (P) (mm) | P/N (mm) | ESL (pH) |
| 1 | 5 × 5 | 0.5 | 0.020 | 9.30 |
| 2 | 4 × 4 | 0.67 | 0.042 | 23.4 |
| 3 | 3 × 3 | 1.0 | 0.111 | 66.9 |
| 4 | 2 × 2 | 2.0 | 0.500 | 300 |

In Table 2 below, in a multi-layer capacitor having the main surfaces with dimensions of about 4.5 mm×4.5 mm, and the inner electrodes with dimensions of about 4.0 mm×4.0 mm, the relationships between the values of P/N and the values of ESL are shown when the total number N of the feed-through conductors and the alignment pitch P of the feed-through conductors were changed.

TABLE 2

| | FEED-THROUGH CONDUCTOR | | | |
|---|---|---|---|---|
| SAMPLE NUMBER | TOTAL NUMBER(N) | ALIGNMENT PITCH (P) (mm) | P/N (mm) | ESL (pH) |
| 5 | 6 × 6 | 0.8 | 0.022 | 9.10 |
| 6 | 5 × 5 | 1.0 | 0.040 | 15.4 |
| 7 | 4 × 4 | 1.33 | 0.083 | 28.2 |
| *8 | 3 × 3 | 2.0 | 0.222 | 81.4 |
| *9 | 2 × 2 | 4.0 | 1.000 | 408 |

In Table 3 given below, in a multi-layer capacitor having the main surfaces with dimensions of about 10.0 mm×10.0 mm, and the inner electrodes having dimensions of about 8.0 mm×8.0 mm, the relationships between the values of P/N and the values of ESL are shown when the total number N of the feed-through conductors and the alignment pitch P of the feed-through conductors were changed.

TABLE 3

| | FEED-THROUGH CONDUCTOR | | | |
|---|---|---|---|---|
| SAMPLE NUMBER | TOTAL NUMBER(N) | ALIGNMENT PITCH (P) (mm) | P/N (mm) | ESL (pH) |
| 10 | 6 × 6 | 1.6 | 0.044 | 12.4 |
| 11 | 5 × 5 | 2.0 | 0.080 | 22.4 |
| *12 | 4 × 4 | 2.67 | 0.167 | 49.2 |
| *13 | 3 × 3 | 4.0 | 0.444 | 140 |
| *14 | 2 × 2 | 8.0 | 2.000 | 643 |

In Tables 1 to 3, the samples having the numbers with the * mark show the cases outside a range of preferred embodiments of the present invention.

Referring to Tables 1 to 3, regardless of the dimensions of the inner electrodes, a correlation between the values of P/N and the values of ESL is confirmed.

In other words, the ESL values of 30 pH or lower can be obtained in sample numbers 1, 2, 5 to 7, 10, 11, and 15 to 17, where the values of P/N are about 0.085 mm or lower. Particularly, as seen in the cases of sample numbers 1, 5, and 6, when the value of P/N is about 0.04 mm or lower, the ESL values of 16 pH or lower can be achieved.

In this way, the smaller the value of P/N, the smaller the value of the ESL. For example, as shown in samples 1 and 5, the value of P/N is about 0.022 mm or lower, and an ESL value of 10 pH or lower can be achieved.

In the above-described preferred embodiments, although the first and second inner electrodes 14 and 15, respectively, preferably have substantially square configurations, the configurations of these inner electrodes can be changed, and, for example, the inner electrodes can have substantially rectangular configurations.

Figure 3:
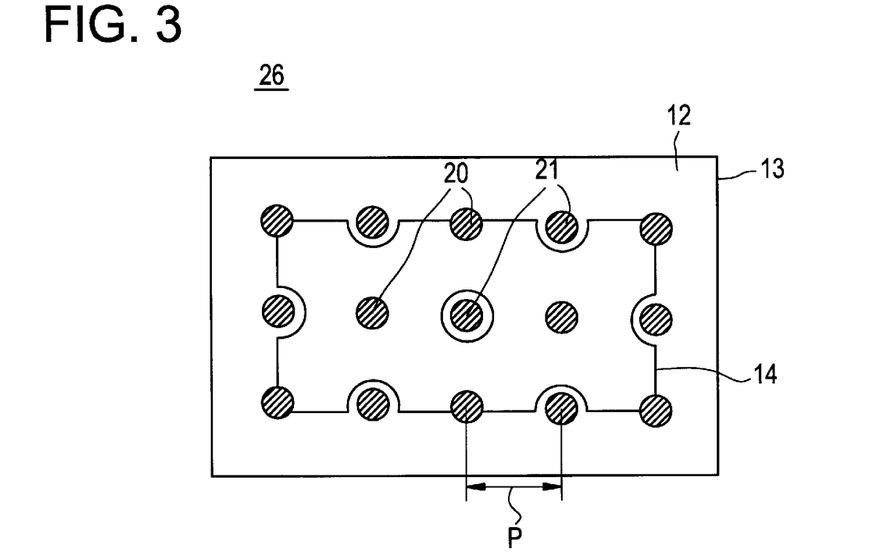
FIG. 3 is a plan view of a multi-layer capacitor 26 according to a second preferred embodiment of the present invention.

FIG. 3 shows a multi-layer capacitor 26 in accordance with a second preferred embodiment of the present invention. This view in FIG. 3 is equivalent to the view shown in FIG. 1A. In the multi-layer capacitor 26 shown in FIG. 3, as described above, the first and second inner electrodes 14 and 15, respectively, preferably have substantially rectangular configurations. In FIG. 3, the same reference numerals are used to indicate similar elements as those shown in FIGS. 1A and 1B, and an explanation thereof is omitted.

As described above, based on the structure of the multi-layer capacitor 26 having the substantially rectangular first and second inner electrodes 14 and 15, respectively, the values of ESL obtained when the total number N of the feed-through conductors 20 and 21 and the alignment pitch of the feed-through conductors 20 and 21 were changed were obtained by the same method as that used in Tables 1 to 3. In FIG. 3, the second inner electrodes 15 are not shown.

In Table 4 below, in a multi-layer capacitor having the main surfaces having dimensions of about 2.5 mm×4.5 mm, and the inner electrodes having dimensions of about 2.0 mm×4.0 mm, the relationships between the values of P/N and the values of ESL are shown when the total number N of the feed-through conductors and the alignment pitch P of the feed-through conductors were changed.

TABLE 4

| SAMPLE NUMBER | FEED-THROUGH CONDUCTOR | | P/N (mm) | ESL (pH) |
|---|---|---|---|---|
| | TOTAL NUMBER(N) | ALIGNMENT PITCH (P) (mm) | | |
| 15 | 5 × 9 | 0.5 | 0.011 | 5.72 |
| 16 | 4 × 7 | 0.67 | 0.024 | 12.7 |
| 17 | 3 × 5 | 1.0 | 0.067 | 29.4 |
| *18 | 2 × 3 | 2.0 | 0.333 | 170 |

In Table 4, the sample number with a * mark shows a sample outside the range of the present invention.

As shown in Table 4, even if the inner electrodes are rectangular, a certain correlation appears between the values of PIN and ESL. In addition, similar to the cases of Tables 1 to 3, when the values of P/N are 0.085 mm or lower as shown in samples 15 to 17, ESL values of 30 pH or lower can be obtained. Furthermore, when the values of PIN are about 0.04 mm or lower as shown in samples 15 and 16, ESL values of 16 pH or lower, more specifically, about 12.7 ph or lower, can be achieved.

Additionally, even if the inner electrodes are substantially rectangular, the smaller the value of P/N, the smaller the value of ESL. When the values of PIN are about 0.011 mm or lower, as shown in sample 15, a significantly low ESL value of about 5.72 pH can be obtained.

As shown in FIGS. 1A and 1B, or FIG. 3, in these preferred embodiments, the first feed-through conductors 20 are disposed adjacent to the second feed-though conductors 21 in such a manner that the first and second feed-through conductors 20 and 21, respectively, are substantially positioned at each corner of substantially square-shaped member. The square defining such a distribution of the first and second feed-through conductors 20 and 21, respectively, does not necessarily need to be a geometrically precise square. This will be illustrated by referring to FIG. 4.

Figure 4:
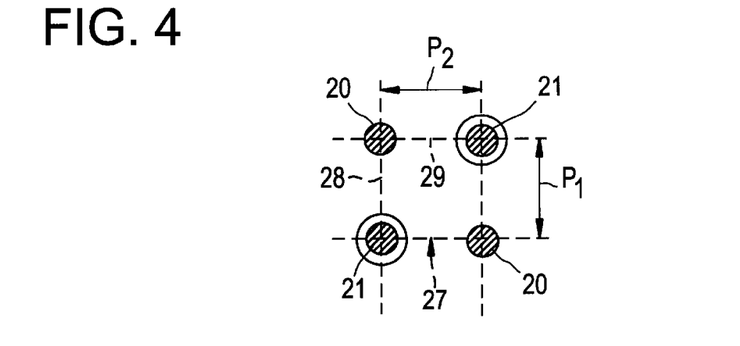
FIG. 4 is a view illustrating a tolerance with respect to a difference between alignment pitches P1 and P2 of first feed-through conductors 20 and second feed-through conductors 21 in a direction along each of first and second sides 28 and 29 which are adjacent to each other, in a square 27 defining a state in which the first and second feed-through conductors 20 and 21 are distributed.

In FIG. 4, some of the first and second feed-through conductors 20 and 21 are illustrated, with a substantially square-shaped member 27 defining the state in which the feed-through conductors 20 and 21 are distributed.

In the substantially square-shaped member 27, regarding the lengths of the adjacent first and second sides 28 and 29, respectively, that is, regarding an alignment pitch P1 in a direction of the first side 28 and an alignment pitch P2 in a direction of the second side 29, for example, when P1 is equal to or larger than P2, a configuration satisfying an inequality P1/P2>1.2 is also substantially regarded as a substantially square-shaped member in this application. However, when an inequality P1/P2=1.2 is satisfied, the magnetic flux generated inside the inner electrodes cannot be effectively canceled, with the result that a reduction in the ESL value cannot be sufficiently achieved.

Figure 5:
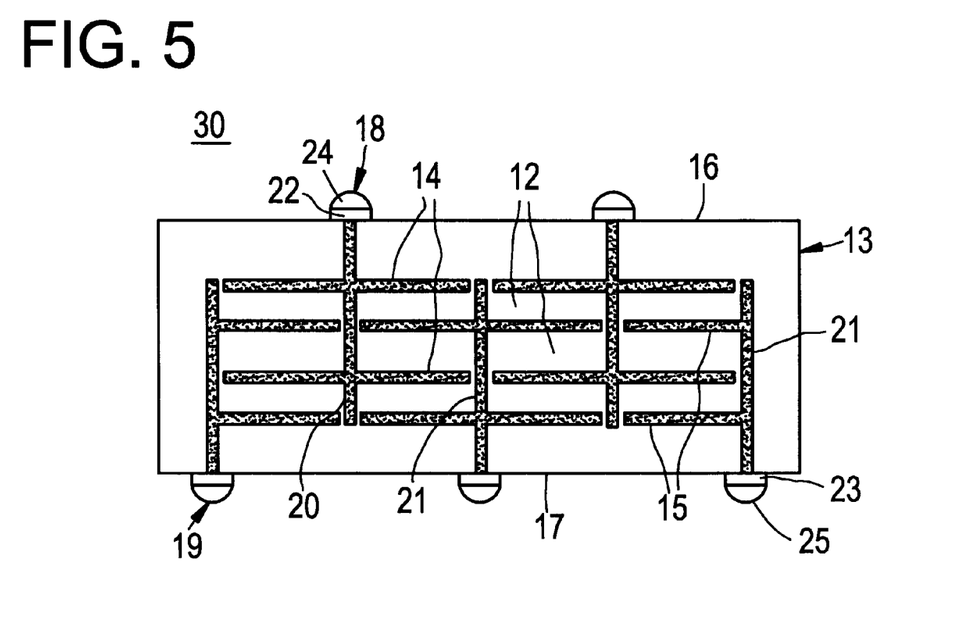
FIG. 5 is a sectional view of a multi-layer capacitor 30 according to a third preferred embodiment of the present invention.

FIG. 5 shows a multi-layer capacitor 30 in accordance with a third preferred embodiment of the present invention. This view is equivalent to the view shown in FIG. 2. In FIG. 5, the same reference numerals are used to indicate similar elements as those shown in FIG. 2, and an explanation thereof is omitted.

In the multi-layer capacitor 30 shown in FIG. 5, first outer terminal electrodes 18 are disposed on one main surface 16 of the capacitor 13, and second outer terminal electrodes 19 are disposed on the other main surface 17 thereof.

Figure 6:
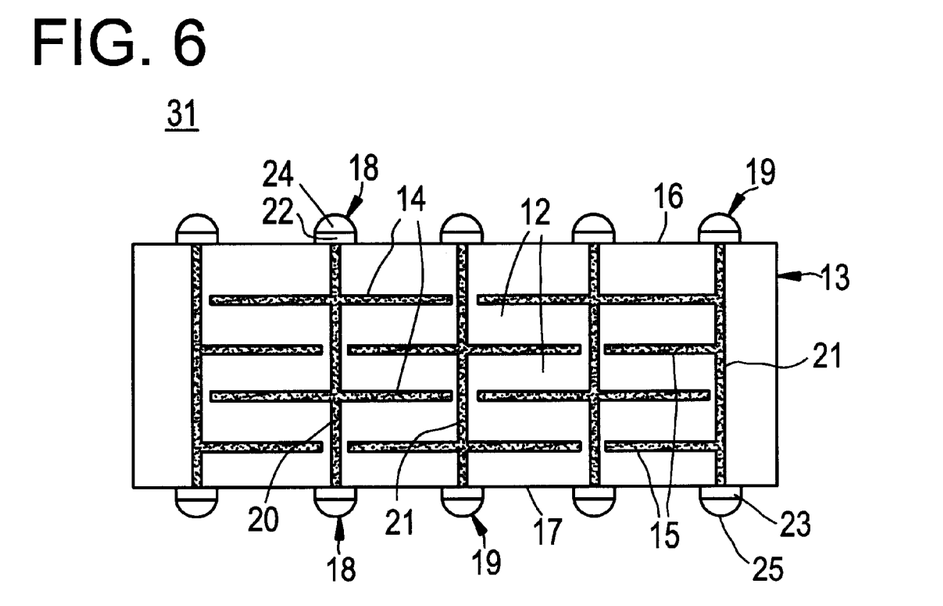
FIG. 6 is a sectional view of a multi-layer capacitor 31 according to a fourth preferred embodiment of the present invention.

FIG. 6 shows a multi-layer capacitor 31 in accordance with a fourth preferred embodiment of the present invention. This view is equivalent to the view shown in FIG. 2. In FIG. 6, the same reference numerals are used to indicate similar elements as those shown in FIG. 2, and an explanation thereof is omitted.

In the multi-layer capacitor 31 shown in FIG. 6, both the first and second outer terminal electrodes 18 and 19 are disposed on the two main surfaces 16 and 17 of the capacitor 13.

In the multi-layer capacitor 11 shown in FIG. 2, currents flowing, on the section shown in FIG. 2, in the first feed-through conductors 20 and the second feed-through conductors 21 are reversed to each other. In contrast, in the multi-layer capacitor 30 shown in FIG. 5 and the multi-layer capacitor 31 shown in FIG. 6, the directions of currents flowing in the first feed-through conductors 20 and the second feed-through conductors 21 can be the same. Accordingly, in terms of advantages with respect to reduction in the ESL value, it is evident that the multi-layer capacitor 11 shown in FIG. 2 provides greater advantages than in the cases of the multi-layer capacitor 30 shown in FIG. 5 and the multi-layer capacitor 31 shown in FIG. 6.

As described above, the multi-layer capacitor in accordance with the present invention is illustrated by referring to each of the preferred embodiments shown in the Figures. However, other various modifications can be applied in terms of the numbers and positions of the inner electrodes, the outer terminal electrodes, and the feed-through conductors used in the present invention, as long as the numbers and positions thereof satisfy the conditions of the value for the ratio P/N described above. Furthermore, the sectional configuration of the feed-through conductors should not be restricted to the substantially circular shapes shown in the figures. For example, substantially quadrangular or substantially hexagonal configurations can be used instead.

The multi-layer capacitor in accordance with preferred embodiments of the present invention, for example, can be advantageously used as a decoupling capacitor 5 disposed in the aforementioned MPU 1 shown in FIG. 8. The structural example in FIG. 7 shows the structure of an MPU using the multi-layer capacitor of the present invention as a decoupling capacitor.

Figure 7:
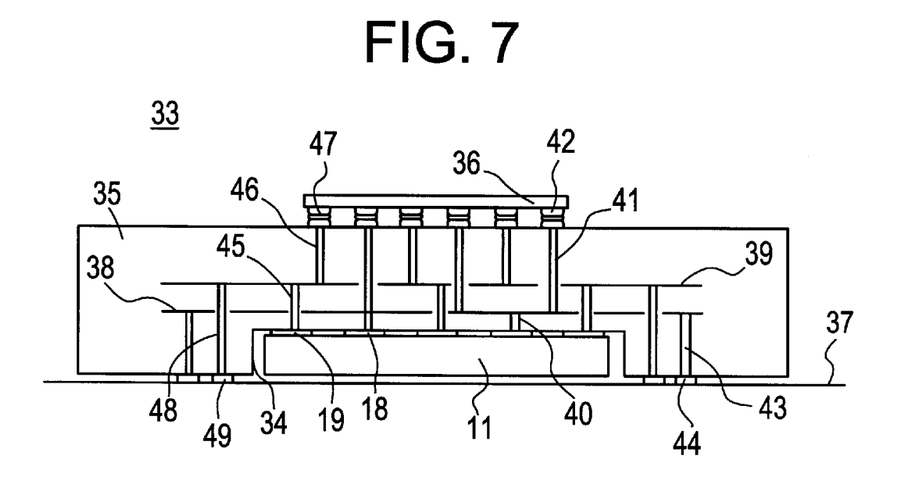
FIG. 7 is a sectional view illustrating a structural example of an MPU 33 including the multi-layer capacitor 11 in accordance with the first preferred embodiment of the present invention defining a decoupling capacitor.

Referring to FIG. 7, an MPU 33 includes a wiring substrate 35 having a multi-layered structure in which a cavity 34 is disposed on the lower surface thereof. An MPU chip 36 is surface-mounted on the upper surface of the wiring substrate 35. In addition, inside the cavity 34 of the wiring substrate 35, the multi-layer capacitor of various preferred embodiments of the present invention, which is arranged to defines a decoupling capacitor, is contained. For example, such a multi-layer capacitor is the multi-layer capacitor 11 constructed according to the first preferred embodiment. Furthermore, the wiring substrate 35 is surface-mounted on a motherboard 37.

As schematically shown in the figure, wiring conductors necessary in the MPU 33 are disposed on a surface of and in the inside of the wiring substrate 35. With these wiring conductors, connections shown in FIG. 8 are obtained. As representative ones among the wiring conductors, a power-supply hot-side electrode 38 and a ground electrode 39 are disposed inside the wiring substrate 35.

The power-supply hot-side electrode 38 is electrically connected to a first outer terminal electrode 18 of the multi-layer capacitor 11 via a power-supply hot-side via-hole conductor 40 and is electrically connected to a specified terminal 42 of the MPU chip 36 via a power-supply hot-side via-hole conductor 41. Furthermore, the power-supply hot-side electrode 38 is electrically connected to a hot-side conductive land 44 of a motherboard 37 via a power-supply hot-side via-hole conductor 43.

In addition, a ground electrode 39 is electrically connected to a second outer terminal electrode 19 of the multi-layer capacitor 1 1 via a ground via-hole conductor 45 and is electrically connected to a specified terminal 47 of the MPU chip 36 via a ground via-hole conductor 46. Furthermore, the ground electrode 39 is electrically connected to a ground-side conductive land 49 of the motherboard 37 via a ground via-hole conductor 48.

In the multi-layer capacitor 11 described above, the first and second outer terminal electrodes 18 and 19 are connected to the via-hole conductors 40 and 45 by bumps, although this is not shown in detail in FIG. 7.

In FIG. 7, a memory unit equivalent to the memory unit 4 shown in FIG. 8 is omitted.

As described above, according to the multi-layer capacitor in accordance with the present invention, at least one pair of first inner electrodes and at least one pair of second inner electrodes, which are mutually opposed via specified dielectric layers, are disposed inside of a capacitor main body, including a plurality of laminated dielectric layers. The main surfaces of the capacitor extend substantially parallel to the inner electrodes, and first outer terminal electrodes and second outer terminal electrodes are disposed on one of the main surfaces. Inside the capacitor, a plurality of first feed-through conductors electrically connecting the first inner electrodes and the first outer terminal electrodes, and a plurality of second feed-through conductors electrically connecting the second inner electrodes and the second outer terminal electrodes are disposed. In this situation, since the first and second feed-through conductors are arranged in such a manner that the feed-through conductors mutually cancel magnetic fields induced by current flowing through the inner electrodes, current flowing through the multi-layer capacitor can be oriented in various directions and the length of current can be shortened. As a result, the value of ESL is very small.

Furthermore, the pluralities of the first and second feed-through conductors are distributed over the entire regions of the first and second inner electrodes, in which the first feed-through conductors are disposed adjacent to the second feed-through conductors in such a manner that the first and second feed-through conductors are substantially positioned at each corner of substantially square-shaped member. In this case, when an alignment pitch of the first and second feed-through conductors is indicated by the symbol P and the total number of the first and second feed-through conductors is indicated by the symbol N, a value of P/N is set about 0.085 mm or lower. Accordingly, since the number of the feed-through conductors is increased while narrowing the alignment pitch, a further reduction in the ESL value can be substantially achieved.

In this way, since preferred embodiments of the present invention define the range of the value of P/N, which effectively reduces the ESL value, an appropriate designing of a multi-layer capacitor for reducing the ESL value can be easily achieved.

Furthermore, in the preferred embodiments of the present invention, since the ESL value can be reduced as described above, a resonant frequency of the multi-layer capacitor is much higher and the frequency band of the multi-layer capacitor serves is much higher. Accordingly, the multi-layer capacitor of preferred embodiments of the present invention is sufficiently adaptable when frequencies of electronic circuits higher. For example, the multi-layer capacitor of preferred embodiments of the present invention can be used as a bypass capacitor or a decoupling capacitor included in high frequency circuits.

Although a fast power supply function is required in the decoupling capacitor used by being combined with an MPU chip or other such apparatus, the multi-layer capacitor in accordance with preferred embodiments of the present invention can be sufficiently adaptable to high-speed operations performed for the fast power-supply function, since the ESL value of the capacitor is very small.

In addition, when the multi-layer capacitor of preferred embodiments of the present invention is mounted on an appropriate wiring substrate, the outer terminal electrodes used in the multi-layer capacitor can be advantageously connected by bumps. Nowadays, for example, in semiconductor chips such as MPU chips, there is a tendency to connect by bumps, as operational frequencies become higher. Disposing main-surface terminal electrodes matches this tendency. Furthermore, connections by bumps allow high-density mounting to be achieved, by which the generation of parasitic inductance in the connections can be suppressed.

In preferred embodiments of the present invention, the unique features described below has advantages in which cancellation of the aforementioned magnetic fields is greatly increased and electrical length is significantly shortened which leads to more effective reduction in the ESL value of the capacitor. Such unique features include a value of P/N is no more than about 0.04 mm and the first and second outer terminal electrodes are disposed only on one main surface of the capacitor.

It should be understood that the foregoing description is only illustrative of the preferred embodiments of the present invention. Various alternatives and modifications can be devised by those of skill in the art without departing from the present invention. Accordingly, the present invention is intended to embrace all such alternatives, modifications and variances which fall within the scope of the appended claims.

What is claimed is:

1. A multi-layer capacitor comprising:

a capacitor body including a plurality of laminated dielectric layers;

at least one pair of first inner electrodes and at least one pair of second inner electrodes, the pairs of inner electrodes being mutually opposed via specified dielectric layers of the plurality of the dielectric layers disposed inside of the capacitor body;

first outer terminal electrodes and second outer terminal electrodes disposed on at least one main surface extending substantially parallel to the inner electrodes; and a plurality of first feed-through conductors and a plurality of second feed-through conductors disposed inside of the capacitor body, the first feed-through conductors passing through specified dielectric layers of the plurality of the dielectric layers to electrically connect the first inner electrodes and the first outer terminal electrodes such that the first feed-through conductors are electrically insulated from the second inner electrodes, and the second feed-through conductors passing through specified dielectric layers of the plurality of the dielectric layers to electrically connect the second inner electrodes and the second outer terminal electrodes such that the second feed-through conductors are electrically insulated from the first inner electrodes;

wherein the plurality of the first feed-through conductors and the plurality of the second feed-through conductors are distributed over the entire areas of the first and second inner electrodes;

wherein the first and second feed-through conductors are arranged such that the feed-through conductors mutually cancel magnetic fields induced by current flowing through the inner electrodes, and the first and second feed-through conductors are disposed adjacent to each other to be distributed substantially at each corner of a substantially square-shaped outline; and wherein, when an alignment pitch of the first and second feed-through conductors is indicated by P and the total number of the first and second feed-through conductors is indicated by N, an arrangement is set such that a value of P/N is about 0.085 mm or lower.

2. A multi-layer capacitor according to claim 1, wherein the value of P/N is equal to or less than about 0.04 mm.

3. A multi-layer capacitor according to claim 1, wherein the first and second outer terminal electrodes are arranged in a dotted configuration corresponding to locations of the first and second feed-through conductors.

4. A multi-layer capacitor according to claim 3, wherein a solder bump is provided at each of the first and second outer terminal electrodes.

5. A multi-layer capacitor according to claim 1, wherein the first and second outer terminal electrodes are disposed only on one main surface of the capacitor.

6. A multi-layer capacitor according to claim 1, wherein the first and second outer terminal electrodes are disposed on both main surfaces of the capacitor.

7. A multi-layer capacitor according to claim 1, wherein the first outer terminal electrodes are disposed on one main surface of the capacitor and the second outer terminal electrodes are disposed on the other main surface thereof.

8. A multi-layer capacitor according to claim 1, wherein the multi-layer capacitor is arranged to define a decoupling capacitor adapted for connection to a power-supply circuit for an MPU chip incorporated in a micro-processing unit.

9. A wiring substrate including the multi-layer capacitor according to claim 1 mounted thereon.

10. A wiring substrate according to claim 9, wherein an MPU chip incorporated in a micro-processing unit is mounted on the wiring substrate with a power-supply hot-side wiring conductor for supplying power used for the MPU chip and a ground wiring conductor, one of the first outer terminal electrodes and the second outer terminal electrodes included in the multi-layer capacitor being electrically connected to the power-supply hot-side wiring conductor, and the other one of the first outer terminal electrodes and the second outer terminal electrodes being connected to the ground wiring conductor.

11. A wiring substrate according to claim 10, wherein the first and second outer terminal electrodes are each connected to the wiring substrate by a bump.

12. A decoupling circuit comprising the multi-layer capacitor according to claim 1.

13. A high-frequency circuit comprising the multi-layer capacitor according to claim 1.

14. A multi-layer capacitor according to claim 1, wherein the at least one pair of first inner electrodes and the at least one pair of second inner electrodes have a substantially rectangular shaped configuration.

15. A multi-layer capacitor according to claim 1, wherein the at least one pair of first inner electrodes and the at least one pair of second inner electrodes have a substantially square shaped configuration.

16. A multi-layer capacitor according to claim 1, wherein a sectional configuration of the feed-through conductors is substantially circular.

17. A multi-layer capacitor according to claim 1, wherein a sectional configuration of the feed-through conductors is one of substantially quadrangular and substantially hexagonal.

18. A multi-layer capacitor comprising:

a capacitor body including a plurality of laminated dielectric layers and having four sides;

at least one pair of first inner electrodes and at least one pair of second inner electrodes, the pairs of first inner electrodes and second inner electrodes being mutually opposed via one of the plurality of the dielectric layers disposed inside of the capacitor body and disposed at various locations in the capacitor body;

first outer terminal electrodes and second outer terminal electrodes disposed on at least one main surface of the capacitor body, the main surface extending substantially parallel to the inner electrodes;

a plurality of first feed-through conductors and a plurality of second feed-through conductors disposed inside of the capacitor body, the first feed-through conductors passing through specified dielectric layers of the plurality of the dielectric layers to electrically connect the first inner electrodes and the first outer terminal electrodes such state that the first feed-through conductors are electrically insulated from the second inner electrodes, and the second feed-through conductors passing through specified dielectric layers of the plurality of the dielectric layers to electrically connect the second inner electrodes and the second outer terminal electrodes in such a state that the second feed-through conductors are electrically insulated from the first inner electrodes;

wherein the first and second feed-through conductors extend from the first and second outer terminal electrodes, respectively, along a major portion of the plurality of dielectric layers, and the first and second feed-through conductors are arranged such that the first and second feed-through conductors mutually cancel magnetic fields induced by current flowing through the inner electrodes; and when an alignment pitch of the first and second feed-through conductors is indicated by P and the total number of the first and second feed-through conductors is indicated by N, an arrangement is set such that a value of P/N is about 0.085 mm or lower.

19. A multi-layer capacitor according to claim 18, wherein each of the first outer terminals is located adjacent to one of the second outer terminals along the at least one major surface of the capacitor body.

20. A multi-layer capacitor according to claim 18, wherein each of the first feed-through conductors is located adjacent to one of the second feed-through conductors within the capacitor body.

21. A multi-layer capacitor according to claim 18, wherein the first outer terminals have a first polarity and the second outer terminals have a second polarity opposite to the first polarity.

22. A multi-layer capacitor according to claim 18, wherein the value of P/N is equal to or less than about 0.04 mm.

23. A multi-layer capacitor according to claim 18, wherein the first and second outer terminal electrodes are arranged in a dotted configuration corresponding to locations of the first and second feed-through conductors.

24. A multi-layer capacitor according to claim 23, wherein a solder bump is provided at each of the first and second outer terminal electrodes.

25. A multi-layer capacitor according to claim 18, wherein the first and second outer terminal electrodes are disposed only on one main surface of the capacitor.

26. A multi-layer capacitor according to claim 18, wherein the first and second outer terminal electrodes are disposed on both main surfaces of the capacitor.

27. A multi-layer capacitor according to claim 18, wherein the first outer terminal electrodes are disposed on one main surface of the capacitor and the second outer terminal electrodes are disposed on the other main surface thereof.

28. A multi-layer capacitor according to claim 18, wherein the multi-layer capacitor is arranged to define a decoupling capacitor adapted for connection to a power-supply circuit for an MPU chip incorporated in a micro-processing unit.

29. A wiring substrate including the multi-layer capacitor according to claim 18 mounted thereon.

30. A wiring substrate according to claim 29, wherein an MPU chip incorporated in a micro-processing unit is mounted on the wiring substrate with a power-supply hot-side wiring conductor for supplying power used for the MPU chip and a ground wiring conductor, one of the first outer terminal electrodes and the second outer terminal electrodes included in the multi-layer capacitor being electrically connected to the power-supply hot-side wiring conductor, and the other one of the first outer terminal electrodes and the second outer terminal electrodes being connected to the ground wiring conductor.

31. A wiring substrate according to claim 30, wherein the first and second outer terminal electrodes are each connected to the wiring substrate by a bump.

32. A decoupling circuit comprising the multi-layer capacitor according to claim 18.

33. A high-frequency circuit comprising the multi-layer capacitor according to claim 18.

34. A multi-layer capacitor according to claim 18, wherein the at least one pair of first inner electrodes and the at least one pair of second inner electrodes have a substantially rectangular shaped configuration.

35. A multi-layer capacitor according to claim 18, wherein the at least one pair of first inner electrodes and the at least one pair of second inner electrodes have a substantially square shaped configuration.

36. A multi-layer capacitor according to claim 18, wherein a sectional configuration of the feed-through conductors is substantially circular.

37. A multi-layer capacitor according to claim 18, wherein a sectional configuration of the feed-through conductors is one of substantially quadrangular and substantially hexagonal.

* * * * *